United States Patent [19]
Bacchi et al.

[11] Patent Number: 5,944,476
[45] Date of Patent: Aug. 31, 1999

[54] UNITARY SPECIMEN PREALIGNER AND CONTINUOUSLY ROTATABLE MULTIPLE LINK ROBOT ARM MECHANISM

[75] Inventors: Paul Bacchi, Novato; Paul S. Filipski, Greenbrae, both of Calif.

[73] Assignee: Kensington Laboratories, Inc., Richmond, Calif.

[21] Appl. No.: 08/824,777

[22] Filed: Mar. 26, 1997

[51] Int. Cl.[6] .................................................... B25J 9/06
[52] U.S. Cl. .................. 414/783; 414/744.3; 414/744.6; 414/816; 414/936; 901/48
[58] Field of Search ............................. 414/744.3, 744.5, 414/744.6, 783, 816, 936, 937, 941; 901/15, 17, 48

[56] References Cited

U.S. PATENT DOCUMENTS

| | | |
|---|---|---|
| 4,065,001 | 12/1977 | Ohnaka . |
| 4,299,533 | 11/1981 | Ohnaka ................................... 414/752 |
| 4,457,664 | 7/1984 | Judell et al. ............................. 414/779 |
| 4,770,590 | 9/1988 | Hugues et al. ....................... 414/936 X |
| 4,787,813 | 11/1988 | Stevens et al. ........................ 414/744.5 |
| 4,813,846 | 3/1989 | Helms ................................... 414/744.1 |
| 4,883,249 | 11/1989 | Garland ................................ 901/48 X |
| 4,897,015 | 1/1990 | Abbe et al. ........................... 414/744.8 |
| 5,007,784 | 4/1991 | Genov et al. ............................ 414/225 |
| 5,064,340 | 11/1991 | Genov et al. ......................... 414/744.5 |
| 5,102,280 | 4/1992 | Poduje et al. ........................... 414/225 |
| 5,151,008 | 9/1992 | Ishida et al. .......................... 414/744.5 |
| 5,314,294 | 5/1994 | Taniguchi et al. .................... 414/744.6 |
| 5,435,683 | 7/1995 | Oosawa et al. ...................... 414/936 X |
| 5,513,946 | 5/1996 | Sawada et al. ....................... 414/744.5 |
| 5,513,948 | 5/1996 | Bacchi et al. ........................... 414/783 |
| 5,584,647 | 12/1996 | Uehara et al. ........................ 414/744.5 |
| 5,626,456 | 5/1997 | Nishi .................................... 414/941 X |

FOREIGN PATENT DOCUMENTS

| | | | |
|---|---|---|---|
| 3-34345 | 2/1991 | Japan ..................................... | 414/936 |

OTHER PUBLICATIONS

Data Sheet for Kensington Laboratories WH–3 Wafer Handler Robot Mechanism (1986).

Drawing figure showing motor arrangement implemented in WH–3 mechanism.

*Primary Examiner*—Janice L. Krizek
*Attorney, Agent, or Firm*—Stoel Rives LLP

[57] ABSTRACT

A unitary prealigner and robot arm includes an upper arm, a forearm, and a hand that is equipped with vacuum pressure outlets to securely hold a specimen. The robot arm is carried atop a tube that is controllably positionable along a Z-axis direction. The prealigner is attached to the tube by a movable carriage that is elevatable relative to the robot arm. The prealigner further includes a rotatable chuck having a vacuum pressure outlet for securely holding a specimen in place within an edge detector assembly that senses a peripheral edge of the specimen. The prealigner may be elevated to receive a specimen from the robot arm or it may be lowered to allow clearance for the robot arm to rotate. In operation, the robot arm retrieves a specimen and places it on the prealigner, which performs an edge scanning operation to determine the effective center and specific orientation of the specimen. The robot arm then performs angular and extension correction operations to position the grasp center of the hand over the effective center of the specimen, thereby placing the hand in a predetermined alignment relative to the specimen. Finally, an exchange of vacuum pressure releases the specimen from the prealigner and secures it once again on the hand, and the robot arm delivers the specimen in the predetermined alignment to a processing station at a second elevation. Specimen processing throughput is increased because specimen retrieval and delivery require only single robot arm movements and because the robot arm and the prealigner move between the first and second elevations concurrently with the specimen being scanned and placed in the predetermined alignment.

34 Claims, 10 Drawing Sheets

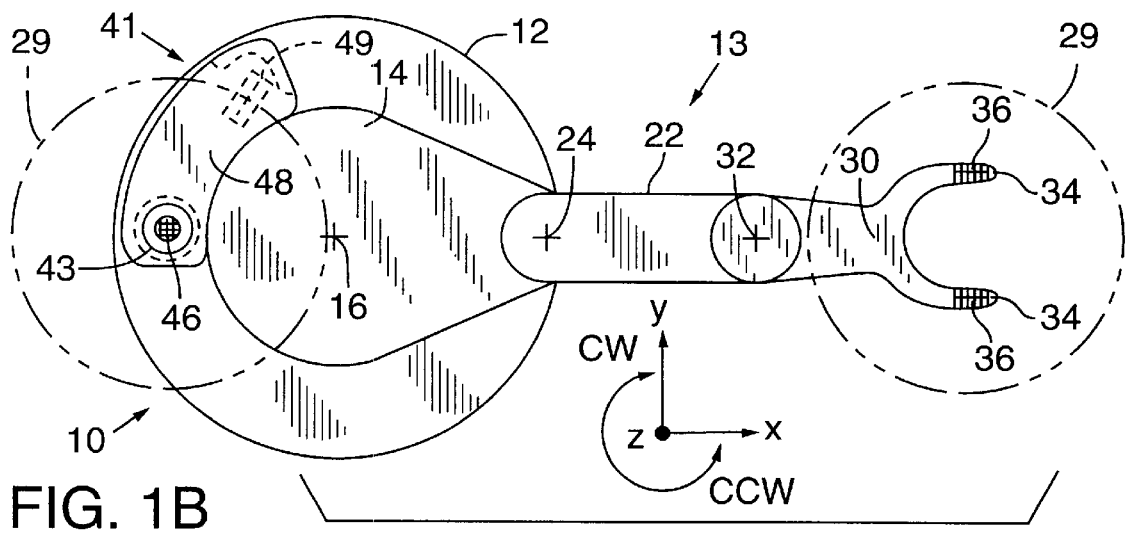
FIG. 1B
FIG. 1A
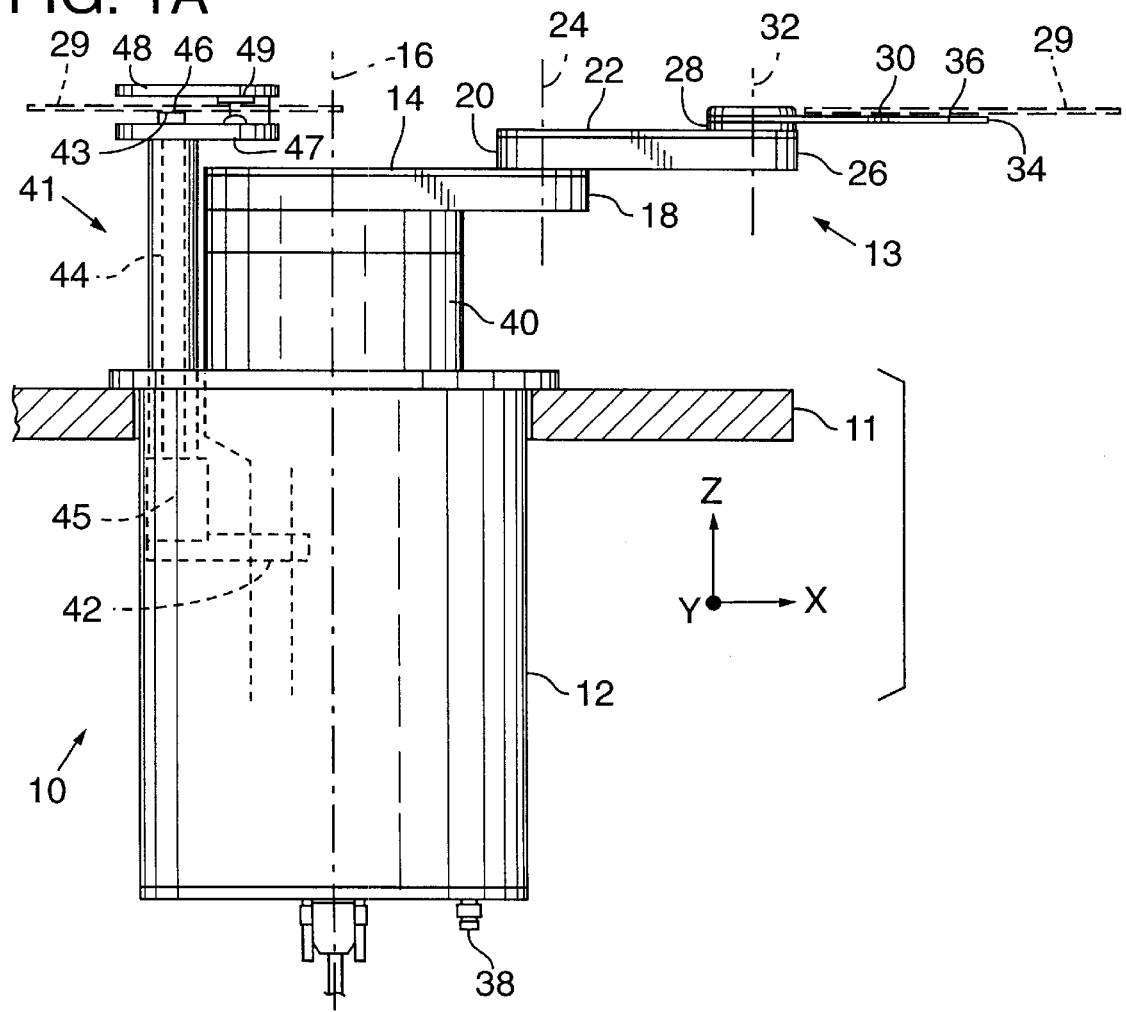

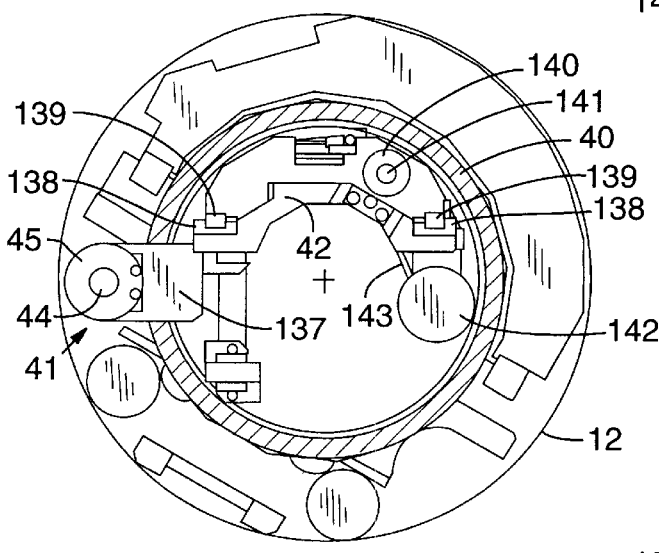
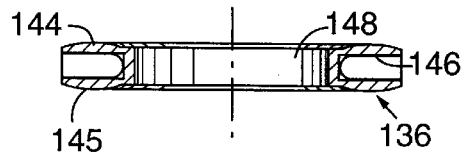
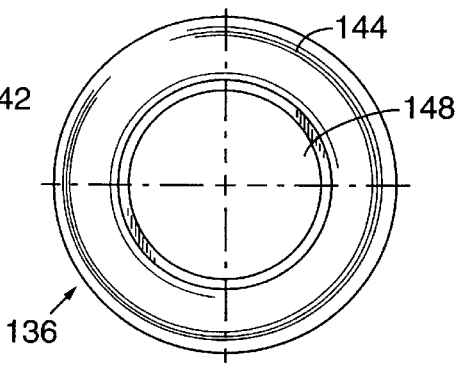
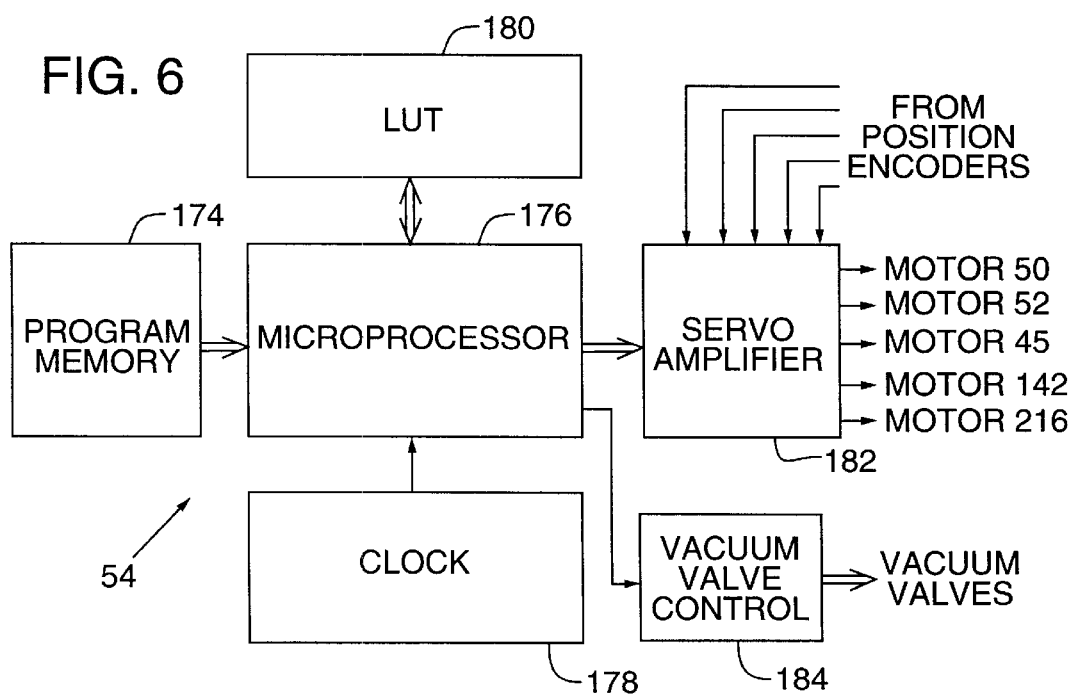

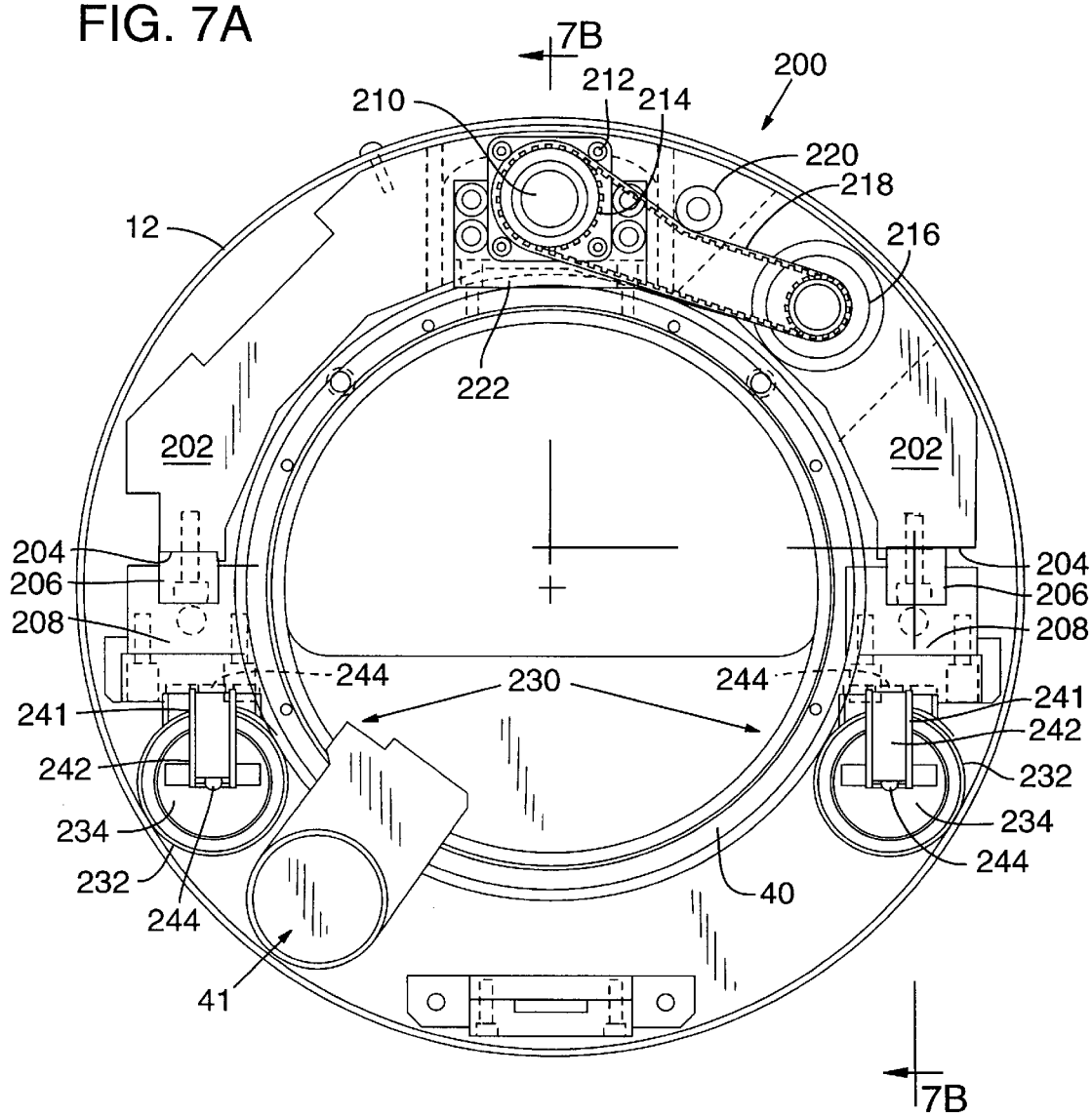

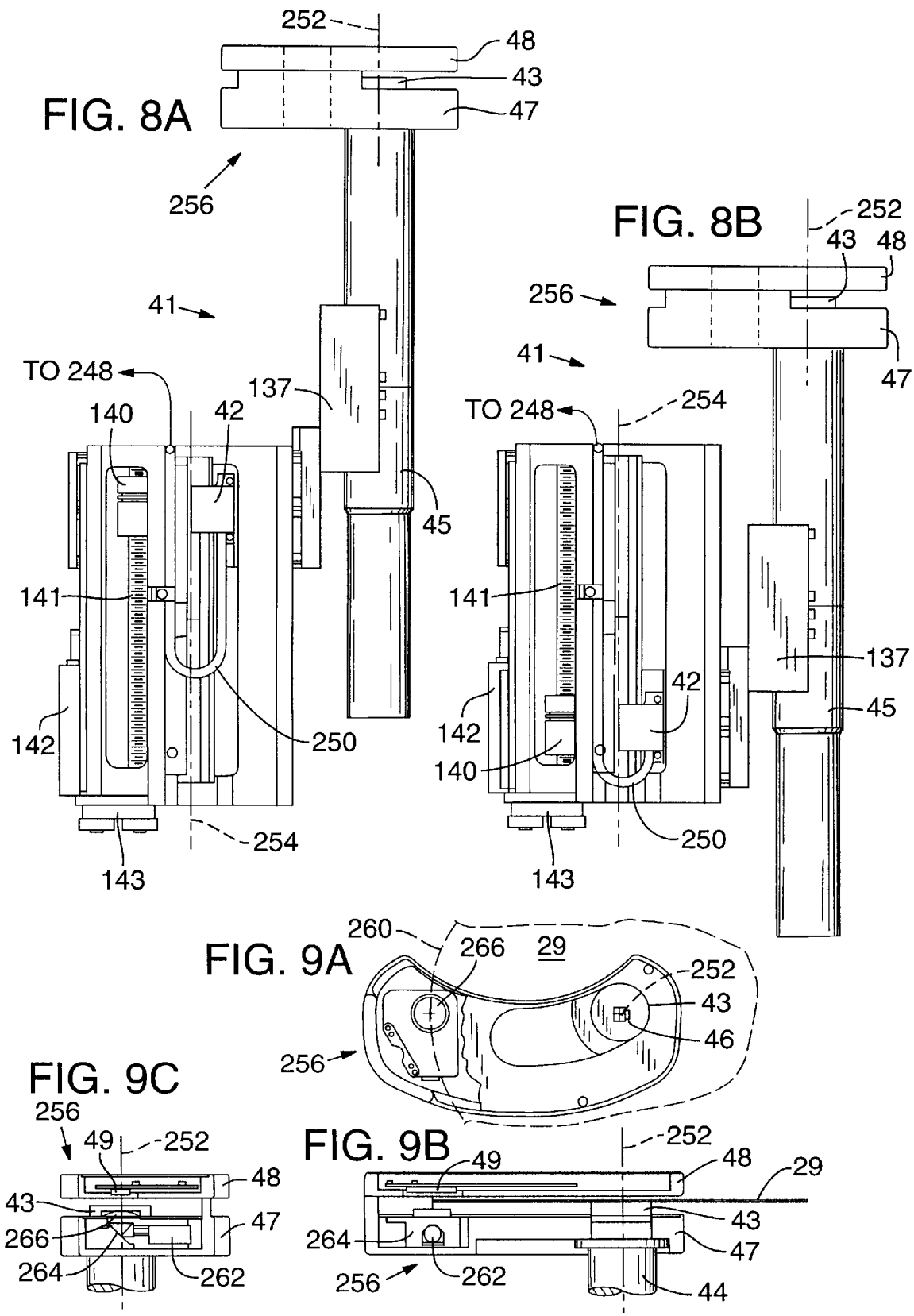

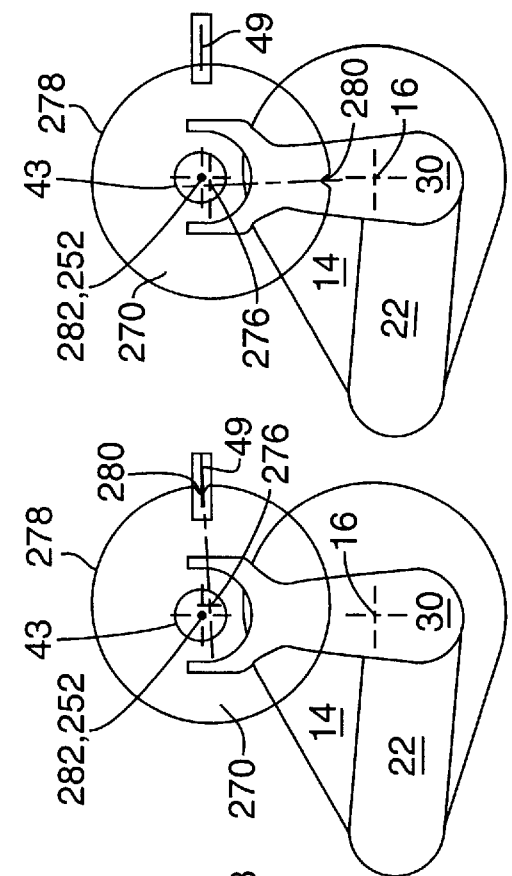
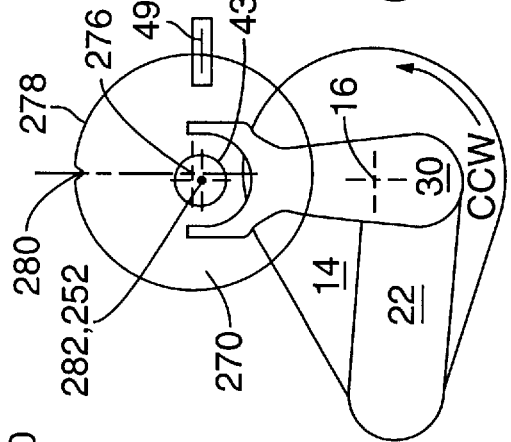
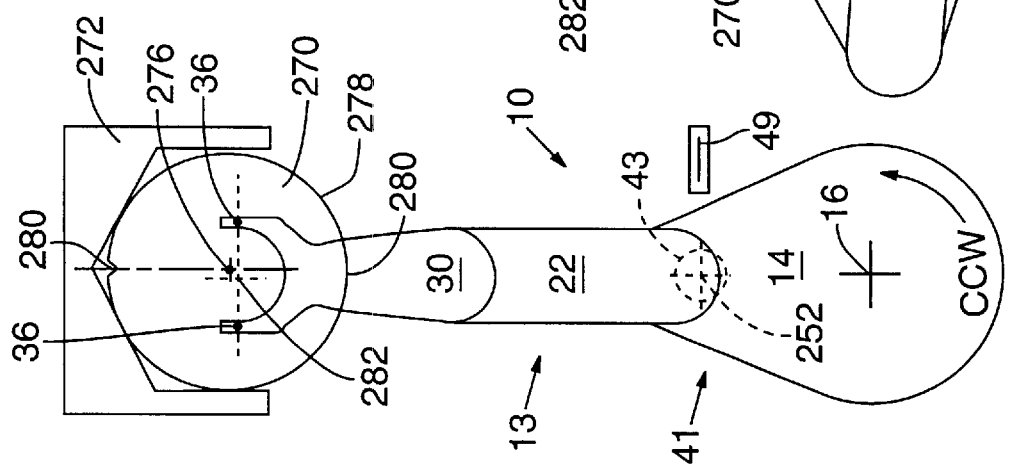

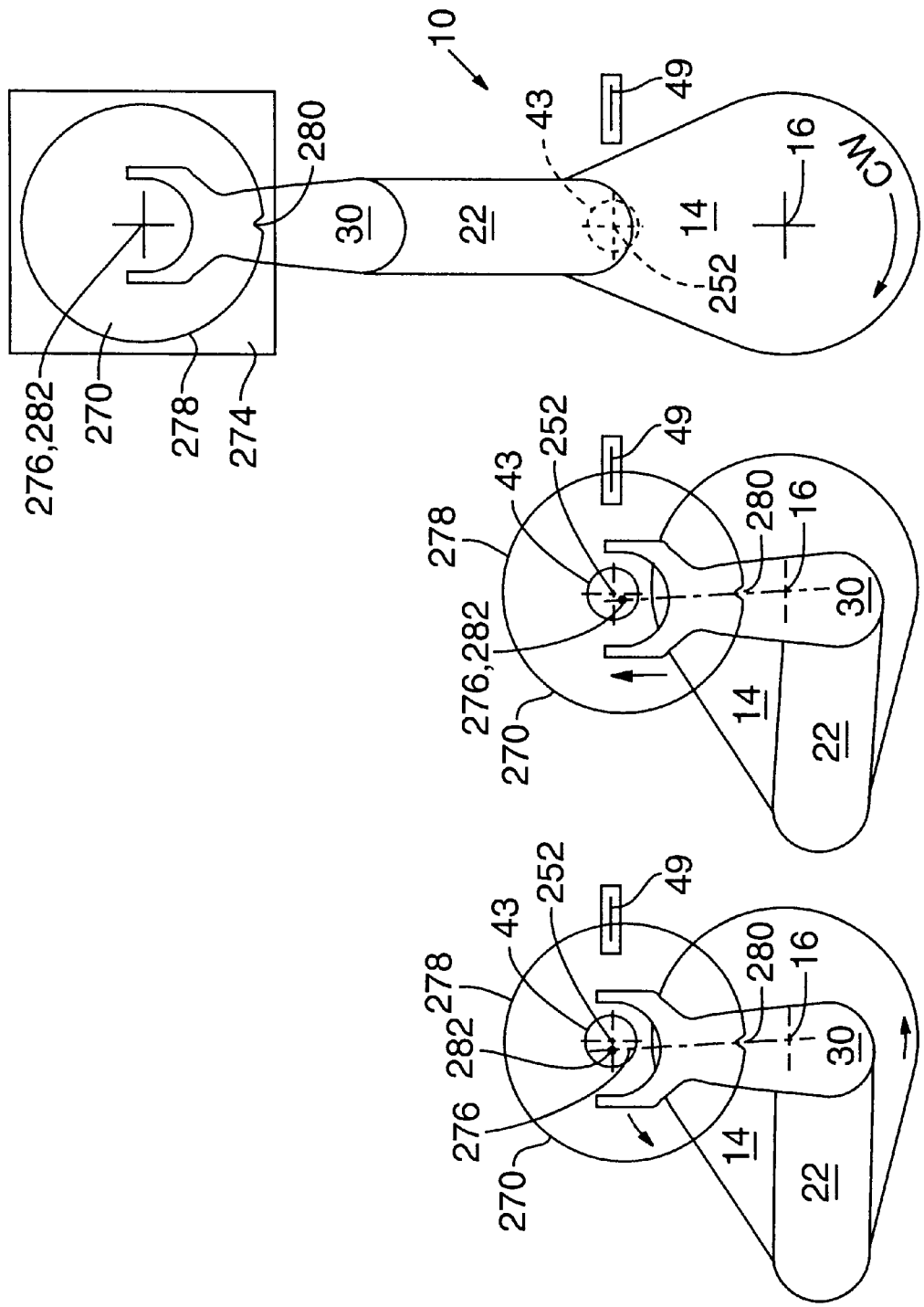

UNITARY SPECIMEN PREALIGNER AND CONTINUOUSLY ROTATABLE MULTIPLE LINK ROBOT ARM MECHANISM

CROSS REFERENCE TO RELATED APPLICATIONS

This application is related to U.S. patent application Ser. No. 08/499,963, now U.S. Pat. No. 5,741,113, and to U.S. patent application Ser. No. 08/834,704.

FEDERALLY SPONSORED RESEARCH OR DEVELOPMENT

Not applicable.

BACKGROUND OF THE INVENTION

This invention relates to robotic specimen handling and aligning mechanisms and, in particular, to a unitary specimen prealigner and continuously rotatable multiple link robot arm mechanism.

Previously known specimen prealigners and robot arm mechanisms employ separate units to perform their specimen handling and prealignment functions serially. Such separate and serial operation naturally leads to reduced specimen handling throughput and precision, creates added expense, and requires an increased work area.

U.S. Pat. No. 5,102,280 of Poduje et al. for ROBOT PREALIGNER describes a robot arm adapted to fetch a substantially disk-shaped specimen from a holder at a first location and elevation and to transport the specimen in a combination of angular, radial, and elevational (Z-axis) movements to a prealigner station. The prealigner station includes a rotating support at a second fixed location and elevation and an edge detector that cooperate to sense offset and angle data as the specimen rotates on the support. The prealigner station rotates the specimen to a predetermined angular alignment and, the robot arm fetches the specimen at an offset compensated orientation from the support and transports it to a processing station at yet another location and elevation. Such a specimen transporting and prealignment process involves considerable wasted motion.

U.S. Pat. No. 5,513,948 of Bacchi et al. for UNIVERSAL SPECIMEN PREALIGNER, which is assigned to the assignee of this application, describes an improved specimen prealigner station in which the rotating platform is further controllably movable in X-axis and Y-axis directions. The prealigner also includes a linear optical array edge detector that cooperates with the X-axis, Y-axis, and rotating movements of the prealigner to rapidly sense offset and angular data for a wide variety of irregularly shaped specimens, such as semiconductor wafers, computer hard disks, or compact disks. Such a prealigner is particularly well-suited to edge sensing semiconductor wafers having alignment flats and notches and some degree of eccentricity. However, the cooperation between the robot arm and the prealigner station still requires considerable wasted motion.

The robot arm mechanisms typically employed with prealigners each include pivotally joined multiple links that are driven by a first motor and are mechanically coupled to effect straight line movement of an end effector or hand and are equipped with a second, independently operating motor to angularly displace the hand about a central axis. Certain robot arm mechanisms are equipped with telescoping mechanisms that move the hand in a direction perpendicular to the plane of straight line movement and angular displacement of the hand. The hand is provided with a vacuum outlet that secures the specimen to the hand as it transports the specimen between processing stations.

U.S. Pat. No. 4,897,015 of Abbe et al. for ROTARY TO LINEAR MOTION ROBOT ARM describes a rotary-to-linear motion robot arm that uses a first motor to control a multi-linkage robot arm to produce straight line radial motion from motor-driven rotary motion. An additional motor may be coupled to the robot arm for operation independent of that of the first motor to angularly move the multi-linkage robot arm without radial motion. Because they independently produce radial motion and angular motion, the first and second motors produce useful robot arm movement when either is operating.

The robot arm of the Abbe et al. patent extends and retracts an end effector, or a hand, along a straight line path by means of a mechanism that pivotally couples in a fixed relationship a first arm, or forearm, and a second arm, or upper arm, so that they move in predetermined directions in response to rotation of the upper arm. To achieve angular displacement of the hand, a $\Theta$ drive motor rotates the entire robot arm structure. The Abbe et al. patent describes no capability of the robot arm to travel along any path other than a straight line or a circular segment defined by a fixed radius.

U.S. Pat. No. 5,007,784 of Genov et al. for DUAL END EFFECTOR ROBOTIC ARM describes a robot arm with an end effector structure that has two oppositely extending hands, each of which is capable of picking up and transporting a specimen. The end effector structure has a central portion that is centrally pivotally mounted about the distal end of a second link or forearm. The extent of pivotal movement about all pivot axes is purposefully limited to prevent damage to vacuum pressure flexible conduits resulting from kinking or twisting caused by over rotation in a single direction.

The coupling mechanism of a first link or upper arm, the forearm, and the end effector structure of the robot arm of the Genov et al. patent is more complex than that of the robot arm of the Abbe et al. patent. Nevertheless, the robot arm structures of the Abbe et al. and Genov et al. patents operate similarly in that each of the end effector structures picks up and transports specimens by using one motor to extend and retract a hand and another, different motor to rotate the entire robot arm structure to allow the hand to extend and retract at a restricted number of different angular positions.

Robot arms of the type described by the Abbe et al. and Genov et al. patents secure a specimen to the hand by vacuum pressure delivered to the hand through vacuum conduits extending through the upper arm, forearm, and hand and around all of the pivot axes. The Abbe et al. patent is silent about a vacuum pressure delivery system, and the Genov et al. patent describes the use of flexible vacuum conduits. The presence of flexible vacuum conduits limits robot arm travel path planning because unidirectional robot arm link rotation about the pivot axes "winds up" the conduits and eventually causes them to break. Thus, preventing conduit breakage requires prohibiting continuous robot arm rotation about any of the pivot axes and necessitates rewind maneuvers and travel path "lockout" spaces as part of robot arm travel path planning. The consequences of such rewind maneuvers are more complex and limited travel path planning, reduced throughput resulting from rewind time, and reduced available work space because of the lockout spaces.

What is needed, therefore, is a specimen handling and prealigner system that is capable of improved throughput, transport, and prealignment accuracy while requiring reduced work space and no movement restrictions.

BRIEF SUMMARY OF THE INVENTION

An object of the invention is, therefore, to provide a unitary prealigner and multiple link robot arm mechanism that has straight line motion, continuous bidirectional rotation capabilities, and high-speed prealignment for efficiently transporting prealigned specimens to virtually any location in a compact work space that is free of lockout spaces.

Another object of this invention is to provide a specimen prealigner that operates in parallel with certain robot arm operations to eliminate wasted motion, thereby increasing specimen processing throughput.

A further object of this invention is to provide a robot arm mechanism that has a counterbalanced Z-axis positioning system that permits the prealigner and robot arm to be accurately and quickly positioned in various combinations of elevational positions.

Still another object of this invention is to provide a robot arm mechanism that uses two high-torque motors, each journaled on rigidly supported bearings and capable of synchronous operation to permit the robot arm to be accurately positioned in various angular and radial positions.

This invention is a unitary prealigner and robot arm mechanism, the latter of which includes an upper arm that rotates about a shoulder axis, a forearm that rotates about an elbow axis, and a hand that rotates about a wrist axis. In a preferred embodiment, the hand is forked and is equipped with vacuum pressure outlets to securely hold a semiconductor wafer, compact disk, or other suitable specimen. The upper arm, forearm, and hand are each capable of continuous clockwise or counterclockwise rotation about their respective axes. The robot arm is carried atop a tube that is controllably elevatable along a Z-axis direction parallel to the shoulder axis. The prealigner mechanism is attached to the tube by a movable carriage that is controllably elevatable relative to the robot arm. The prealigner mechanism further includes a controllably rotatable chuck having a vacuum pressure outlet for securely holding a specimen in place within an edge detector assembly that is fitted with a linear detector array for sensing a peripheral edge of the specimen. The prealigner mechanism may be elevated to receive a specimen from the hand of the robot arm or may be lowered to allow clearance for the robot arm to rotate continuously.

In a preferred method of operation, the robot arm grasps a specimen at a first elevation while the prealigner mechanism is lowered to clear the robot arm. As the robot arm retrieves the specimen, the prealigner mechanism is elevated to receive the specimen. The prealigner mechanism then performs an edge scanning operation to determine the angular, X-axis, and Y-axis locations of the effective center and specific orientation of the specimen, after which it is rotated to a known alignment relative to the robot arm hand. Next, the robot arm performs angular and extension correction operations to position the grasp center of the hand over the effective center of the specimen, thereby placing the hand in a predetermined alignment relative to the specimen. Finally, an exchange of vacuum pressure releases the specimen from the prealigner and secures it once again on the hand, and the robot arm delivers the specimen in the predetermined alignment to a processing station at a second elevation. Specimen processing throughput is increased because specimen retrieval and delivery require only a single sequence of robot arm movements and because the robot arm and the prealigner mechanism move between the first and second elevations concurrently with scanning the specimen and placing it in the predetermined alignment.

Additional objects and advantages of this invention will be apparent from the following detailed description of a preferred embodiment thereof that proceeds with reference to the accompanying drawings.

BRIEF DESCRIPTION OF THE SEVERAL VIEWS OF THE DRAWINGS

FIGS. 1A and 1B are respective side elevation and plan views of a unitary specimen prealigner and three-link robot arm mechanism of the present invention.

FIG. 4B is a sectional view taken along lines 4B—4B of FIG. 4A showing the interior components, motors, and carriages of the unitary prealigner and robot arm mechanism of FIGS. 1A and 1B.

FIGS. 5A and 5B are respective side elevation and plan views of a rotary vacuum slip ring installed at rotary joints of the unitary prealigner and robot arm mechanism of FIGS. 1A and 1B.

FIG. 6 is a block diagram of the motor controller for the preferred embodiment of the robot arm mechanism of the invention.

FIG. 7A is a sectional top plan view showing a structural backbone, tube, Z-axis movement assembly, carriages, and vacuum counterbalance system of the unitary prealigner and robot arm mechanism of FIGS. 1 and 4.

FIGS. 8A and 8B are rear elevation views of the prealigner and movable carriage assembly portions of FIGS. 1 and 4 shown respectively in fully elevated and fully lowered positions to reveal stationary and movable components thereof.

FIGS. 9A, 9B, and 9C are respective top, side, and end views of a specimen edge detector of the prealigner assembly of this invention shown cut away to reveal the spatial relationships of its internal components.

FIGS. 10A through 10G show a series of various positions of a preferred embodiment of the unitary prealigner and robot arm mechanism of this invention as it sequentially retrieves a specimen in an arbitrary alignment, performs specimen alignment steps, and delivers the specimen in a predetermined alignment for further processing.

DETAILED DESCRIPTION OF THE INVENTION

Figure 2:
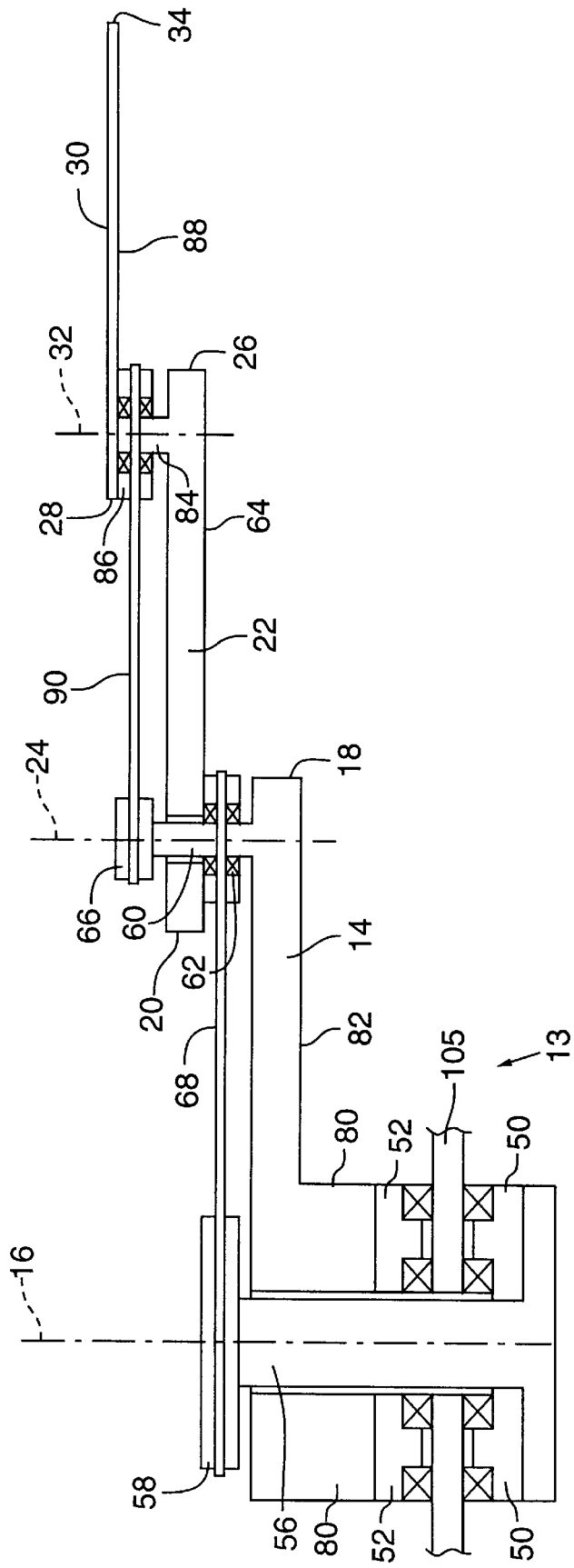
FIG. 2 is a side elevation view in stick diagram form showing the high-torque motors, link components, and associated mechanical linkages of the robot arm mechanism of FIGS. 1A and 1B.

FIGS. 1A and 1B show a unitary prealigner and three-link robot arm mechanism 10 (hereafter "unitary mechanism 10") mounted on and through an aperture in the top surface of a support table 11. Unitary mechanism 10 comprises a base housing 12 to which is mounted a robot arm 13 that includes an upper arm 14 which is mounted for rotation about a shoulder axis 16. Upper arm 14 has a distal end 18 to which a proximal end 20 of a forearm 22 is mounted for rotation about an elbow axis 24, and forearm 22 has a distal end 26 to which a proximal end 28 of an end effector structure comprising a hand 30 is mounted for rotation about a wrist axis 32. Hand 30 is preferably forked and is equipped at its distal ends 34 with vacuum pressure outlets 36 that apply vacuum pressure supplied to unitary mechanism 10 at a vacuum pressure inlet 38 to securely hold a semiconductor wafer (shown in phantom in two alternate positions), compact disk, or other suitable specimen 29 in place on hand 30. As will be described in detail later, each of upper arm 14, forearm 22, and hand 30 is capable of continuous clockwise ("CW") or counter-clockwise ("CCW") rotation about its respective shoulder axis 16, elbow axis 24, and wrist axis 32. Additionally, robot arm 13 is carried atop a tube 40 that is controllably positionable along a Z-axis direction parallel to shoulder axis 16.

Unitary mechanism 10 further includes a prealigner mechanism 41, which is attached to tube 40 by a movable carriage 42 (shown in dashed lines) that is controllably positionable along the Z-axis direction and relative to robot arm 13. Prealigner mechanism 41 further includes a chuck 43 that is rotated by a shaft 44 attached to a motor 45. Chuck 43 is equipped with a vacuum pressure outlet 46 that applies vacuum pressure supplied to unitary mechanism 10 at vacuum pressure inlet 38 to hold specimen 29 securely in place.

When held in place on chuck 43 and rotated by motor 45, specimen 29 fits between a lower arm 47 and an upper arm 48 of an edge detector assembly in which is fitted a linear detector array 49 that senses the rotating peripheral edge of specimen 29. In FIG. 1A, prealigner mechanism 41 is shown by way of example only at a Z-elevation suitable for receiving specimen 29 from hand 30 of robot arm 13. Of course, prealigner mechanism 41 may be lowered to a Z-elevation that allows clearance for robot arm 13 to continuously rotate.

FIG. 2 shows the drive motors, link components, and associated mechanical components of robot arm 13. Robot arm 13 is positioned by first and second motors 50 and 52 that operate in response to commands provided by a motor controller 54 that is described with reference to FIG. 6. First motor 50 rotates forearm 22 about elbow axis 24, and second motor 52 rotates upper arm 14 about shoulder axis 16.

More specifically, first motor 50 rotates a forearm spindle 56 that extends through an aperture in upper arm 14 and terminates in an upper arm pulley 58. A post 60 extends upwardly at distal end 18 of upper arm 14 through the center of a bearing 62 that is mounted to a bottom surface 64 of forearm 22 at its proximal end 20. Post 60 also extends through an aperture in forearm 22 and terminates in a forearm pulley 66. An endless belt 68 connects upper arm pulley 58 and the outer surface of bearing 62 to rotate forearm 22 about elbow axis 24 in response to rotation of first motor 50.

Second motor 52 rotates an upper arm spindle 80 that is mounted to a bottom surface 82 of upper arm 14 to rotate upper arm 14 about shoulder axis 16. Coordinated operation of first and second motors 50 and 52 in conjunction with the mechanical linkage described below causes hand 30 to rotate about shoulder axis 16. A post 84 extends upward through the center of a bearing 86 that is mounted to a bottom surface 88 of hand 30. An endless belt 90 connects forearm pulley 66 to the outer surface of bearing 86 to rotate hand 30 about shoulder axis 16 in response to the coordinated rotational motions of motors 50 and 52.

The mechanical linkage coupling upper arm 14 and forearm 22 forms an active drive link and a passive drive link. The active drive link includes endless belt 68 connecting upper arm pulley 58 and the outer surface of bearing 62 and causes forearm 22 to rotate in response to rotation of first motor 50. The passive drive link includes endless belt 90 connecting forearm pulley 66 and the outer surface of bearing 86 and causes hand 30 to rotate about wrist axis 32 in response to rotation of forearm 22 about elbow axis 24. Rotation of hand 30 can also be caused by a complex interaction among the active and passive drive links and the rotation of upper arm 14 in response to rotation of second motor 52.

Figure 3:
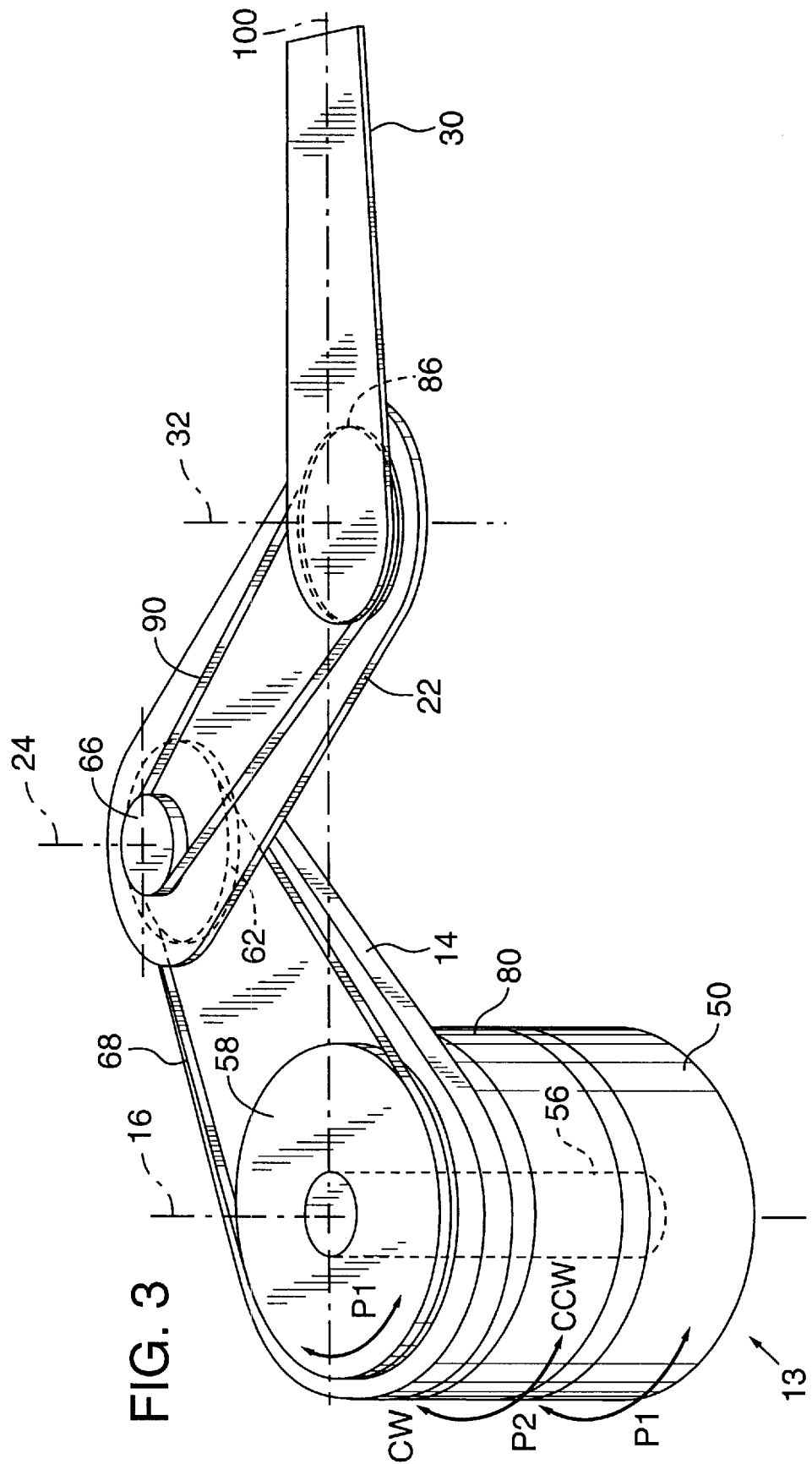
FIG. 3 is an isometric view in stick diagram form showing the rotational motion imparted by the high-torque motor drive links of the mechanical linkage of the robot arm mechanism of FIGS. 1A and 1B.

Motor controller 54 (FIG. 6) controls motors 50 and 52 in at least two preferred operational states to enable robot arm 13 to perform two principal motion sequences. The first motion sequence changes the extension or radial position of hand 30 (only the X-axis radial directions are shown in FIGS. 1A and 1B), and the second motion sequence changes the angular position of hand 30 relative to shoulder axis 16 (the CW and CCW directions of FIG. 1B). FIG. 3 is a useful diagram for showing the two motion sequences.

With reference to FIGS. 2 and 3, in the first operational state, motor controller 54 causes first motor 50 to maintain the position of forearm spindle 56 and second motor 52 to rotate upper arm spindle 80. The non-rotation of first motor 50 maintains the position of upper arm pulley 58, and the rotation of upper arm spindle 80 by second motor 52 rotates upper arm 14 about shoulder axis 16, thereby causing rotation of forearm 22 about elbow axis 24 and counterrotation of hand 30 about wrist axis 32. Because the ratio of the diameters of upper arm pulley 58 and the outer surface of bearing 62 is 4:2 and the ratio of the diameters of forearm pulley 66 and the outer surface of bearing 86 is 1:2, the rotation of upper arm 14 in a direction specified by $P_2$, shown in FIG. 3, will cause hand 30 to move along a straight line path 100. (The diameters of forearm pulley 66 and the outer surface of bearing 86 are one-half of the respective diameters of the outer surface of bearing 62 and upper arm pulley 58 to streamline the sizes and shapes of forearm 22 and hand 30.)

Whenever upper arm 14 rotates in the CW direction specified by $P_2$, hand 30 extends (i.e., increases radial distance from shoulder axis 16) along path 100. Whenever upper arm 14 rotates in the CCW direction specified by $P_2$, hand 30 retracts (i.e., decreases radial distance from shoulder axis 16) along path 100. Skilled persons will appreciate that robot arm 13, in a mirror image configuration of that shown in FIG. 3, would extend and retract in response to upper arm 14 rotations in directions opposite to those described.

In the second operational state, motor controller 54 causes first motor 50 to rotate forearm spindle 56 in the direction specified by $P_1$ and second motor 52 to rotate upper arm spindle 80 in the direction specified by $P_2$. In the special case in which motors 50 and 52 are synchronized to rotate in the same direction by the same amount of displacement, hand 30 is only angularly displaced about shoulder axis 16. This is so because the rotation of forearm 22 about elbow axis 24, caused by the rotation of first motor 50, and the rotation of hand 30 about wrist axis 32, caused by the rotation of second motor 52 and the operation of the passive drive link, offset each other to produce no net rotation about elbow axis 24 and wrist axis 32. Thus, hand 30 is fixed radially at a point along path 100 and describes a circular path as only upper arm 14 rotates about shoulder axis 16. By application of kinematic constraints to achieve a desired travel path for hand 30, motor controller 54 can operate first and second motors 50 and 52 to move robot arm 13 along nonradial straight line paths, as will be further described below.

Skilled persons will appreciate that to operate robot arm 13, first and second motors 50 and 52 are coupled by either rotating both of them or grounding one while rotating the other one. For example, robot arm 13 can be operated such that forearm 22 rotates about elbow axis 24. Such motion would cause hand 30 to describe a simple spiral path between shoulder axis 16 and the full extension of hand 30. This motion is accomplished by fixing the position of upper arm 14 and operating motor 50 to move forearm 22. Applicants note that the prior art described above is incapable of rotating the elbow joint without also rotating the shoulder joint, thereby requiring the operation of two motors.

Figure 4A:
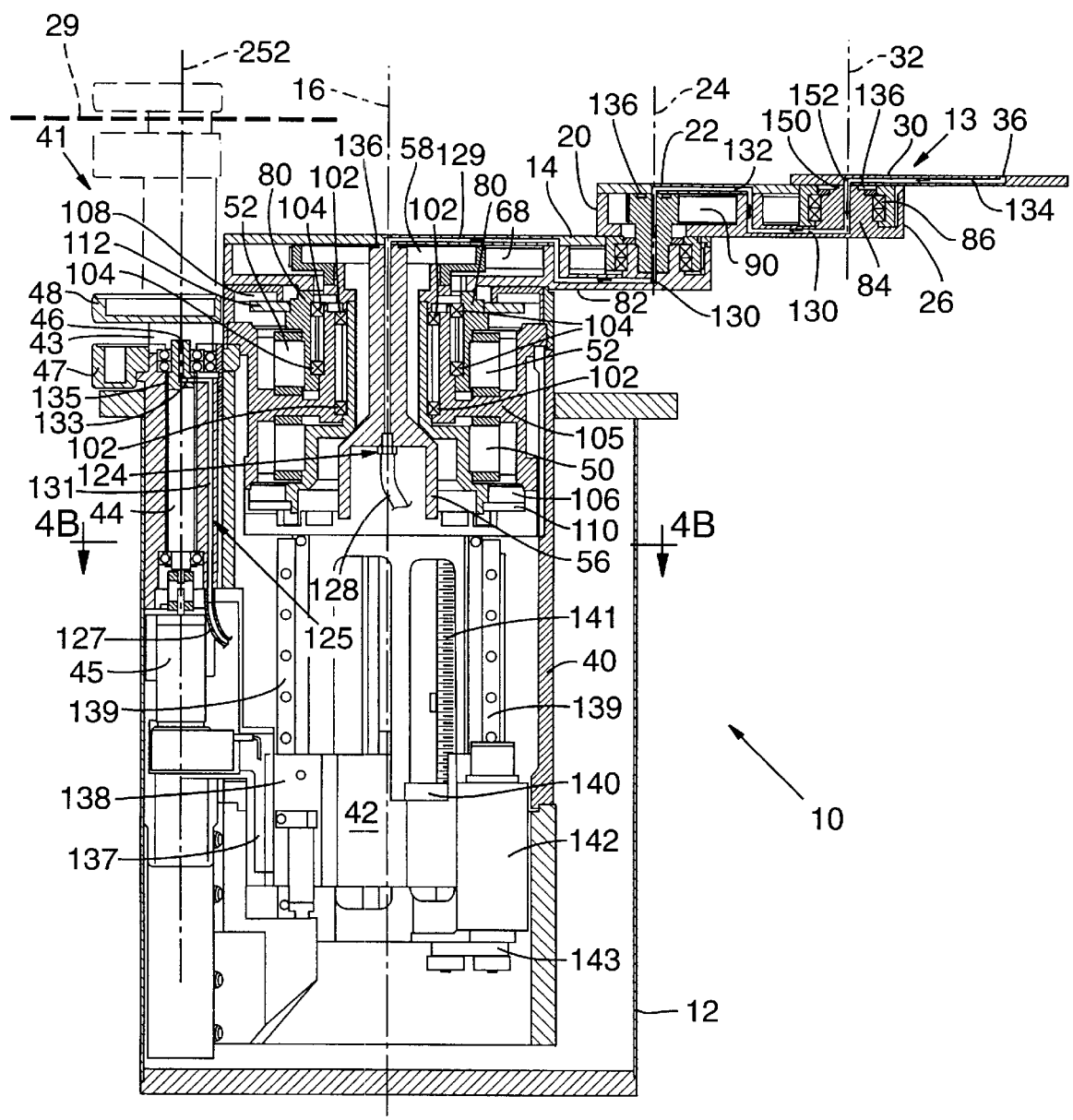
FIG. 4A is a cross-sectional plan view showing the interior components, motors, carriages, mechanical linkages, and vacuum pressure line paths of the unitary prealigner and robot arm mechanism of FIGS. 1A and 1B.

FIGS. 4A and 4B show the interior components, motors, mechanical linkages, and vacuum pressure conduits of unitary mechanism 10 shown in FIGS. 1A and 1B. Base housing 12 contains first motor 50 and second motor 52 arranged in concentric relation such that their respective forearm spindle 56 and upper arm spindle 80 rotate about shoulder axis 16. Forearm spindle 56 is positioned nearer to shoulder axis 16 and is directly connected to upper arm pulley 58, which is journalled for rotation on bearings 102. Upper arm spindle 80 is positioned farther radially from shoulder axis 16 and is directly connected to bottom surface 82 of upper arm 14, which is journalled for rotation on bearings 104. Unlike prior robot arm motor assemblies, which have bearings journaled on top of bearings, bearings 102 and bearings 104 are separately journaled to a rigid support structure 105 to improve the lateral stability of robot arm 13 and to reduce wear-related tolerance buildups.

The angular positions of motors 50 and 52 are tracked by respective glass scale encoders 106 and 108. Encoders 106 and 108 include respective annular diffraction grating scales 110 and 112. Such glass scale encoders are known to skilled persons.

Prealigner mechanism 41 is controllably positionable along the Z-axis direction by a motor 45 that is joined to movable carriage 42 with a rigid member 137. Movable carriage 42 includes a pair of bearing trucks 138 that glide along tracks 139 which are coupled to the interior of tube 40. Movable carriage 42 further includes a leadnut assembly 140 that rides along a leadscrew 141 that is coupled to a motor 142 by an endless belt 143. Controllable rotation of leadscrew 141 by motor 142 causes movable carriage 42 and prealigner mechanism 41 to move in the Z-axis direction along tracks 139 to alternate positions, one of which is shown in dashed lines. A conventional linear encoder scale (not shown) couples movable carriage 42 to motor controller 54 for accurately determining the positions of prealigner mechanism 41 relative to tube 40. Likewise, a conventional rotary encoder (not shown) couples shaft 44 to motor controller 54 for accurately determining the angular positions of chuck 43. The mechanism for moving tube 40 in the Z-axis direction is described with reference to FIGS. 7A and 7B.

Vacuum pressure conduits 124 and 125 in respective robot arm 13 and prealigner mechanism 41 each include multiple path segments extending from vacuum pressure inlet 38 in base housing 12 to vacuum pressure outlets 36 and 46 in hand 30 and chuck 43. In the preferred embodiment described, vacuum pressure conduits 124 and 125 each deliver vacuum pressure but are capable of delivering positive amounts of pressure. Path segments 127 and 128 in base housing 12 are flexible hoses.

Robot arm 13 path segments 129, 130, 132, and 134 in the respective base housing 12, upper arm 14, forearm 22, and hand 30 are either channels formed by complementary depressions in mating components or holes passing through solid components. Each of outlets 36 constitutes a hole surrounded by a depression in the specimen-contacting surface of hand 30. Each path segment terminating or originating at shoulder axis 16, elbow axis 24, and wrist axis 32 includes a rotary vacuum slip ring 136 that functions as a vacuum feedthrough conduit which permits continuous rotation of the respective path segment without significant loss of vacuum pressure.

Prealigner mechanism 41 path segment 131 adjacent to shaft 44 and path segment 133 in shaft 44 are either channels formed by complementary depressions in mating components or holes passing through solid components. Outlet 46 constitutes a hole surrounded by a depression in the specimen-contacting surface of chuck 43. The rotating joint at the junction of path segments 131 and 133 includes a rotary vacuum O-ring seal 135 that functions as a vacuum feedthrough conduit that permits continuous rotation of shaft 44 without significant loss of vacuum pressure.

FIGS. 5A and 5B show rotary vacuum slip ring 136, which is fitted into each of the rotary joints at shoulder axis 16, elbow axis 24, and wrist axis 32. For purposes of convenience only, the following describes the operation of slip ring 136 in the rotary joint defining wrist axis 32.

With reference to FIGS. 4A, 4B, 5A, and 5B, slip ring 136 includes a convex upper surface 144 and a convex lower surface 145 separated by an annular leaf spring 146. Each of surfaces 144 and 145 is preferably made of a reinforced Teflon® copolymer and has a central aperture 148. When it is fitted in a rotary joint, slip ring 136 receives through central aperture 148 a protrusion 150 from the top surface of post 84 that extends from distal end 26 of forearm 22. Protrusion 150 has a hole 152 that extends into and through post 84 along its entire length and is in vacuum communication with vacuum path segment 132 within forearm 22. The wrist joint formed by forearm 22 and hand 30 causes upper surface 144 to fit against an interior vacuum channel surface (not shown) of hand 30 and lower surface 145 to fit against a depression (not shown) in the top surface of post 84. The raised upper and lower surfaces 144 and 145 compress against leaf spring 146 and form a vacuum seal for the space between the top of protrusion 150 and the vacuum channel surface of hand 30. The reinforced copolymer material from which upper surface 144 is made forms a bearing surface that maintains a vacuum-tight seal during rotary motion about wrist axis 32.

The mechanical construction of robot arm 13 does not restrict hand 30 to straight line motion but provides two degrees of freedom to achieve complex trajectories. This is beneficial because it facilitates specimen processing layouts to provide relatively small footprints and processing component placements that enhance ergonomic loading of specimens. A common application is to access specimens in straight line, rather than complex, hand movements. A more complete description of how a skilled person would implement controller 54 to carry out various specimen access operations is given in U.S. Pat. No. 5,741,113, for CON- TINUOUSLY ROTATABLE MULTIPLE LINK ROBOT ARM MECHANISM, which is assigned to the assignee of this application and incorporated herein by reference.

FIG. 6 shows the primary components of controller 54, which includes a program memory 174 that stores move sequence instructions for robot arm 13. A microprocessor 176 receives from program memory 174 the move sequence instructions and interprets them to determine whether the first or second operational state is required. A system clock 178 controls the operation of microprocessor 176. A lookup table (LUT) 180 stores corresponding values for motors 50 and 52 to accomplish the straight line motion of the first operational state and the angular displacements to accomplish the angular motion of the second operational state. Microprocessor 176 provides robot arm 13 motor positioning signals to a servomechanism amplifier 182, which delivers corresponding command signals to motors 52 and 50. Servomechanism amplifier 182 receives from glass scale encoders 106 and 108 signals indicative of the angular positions of the respective motors 50 and 52.

Figure 7B:
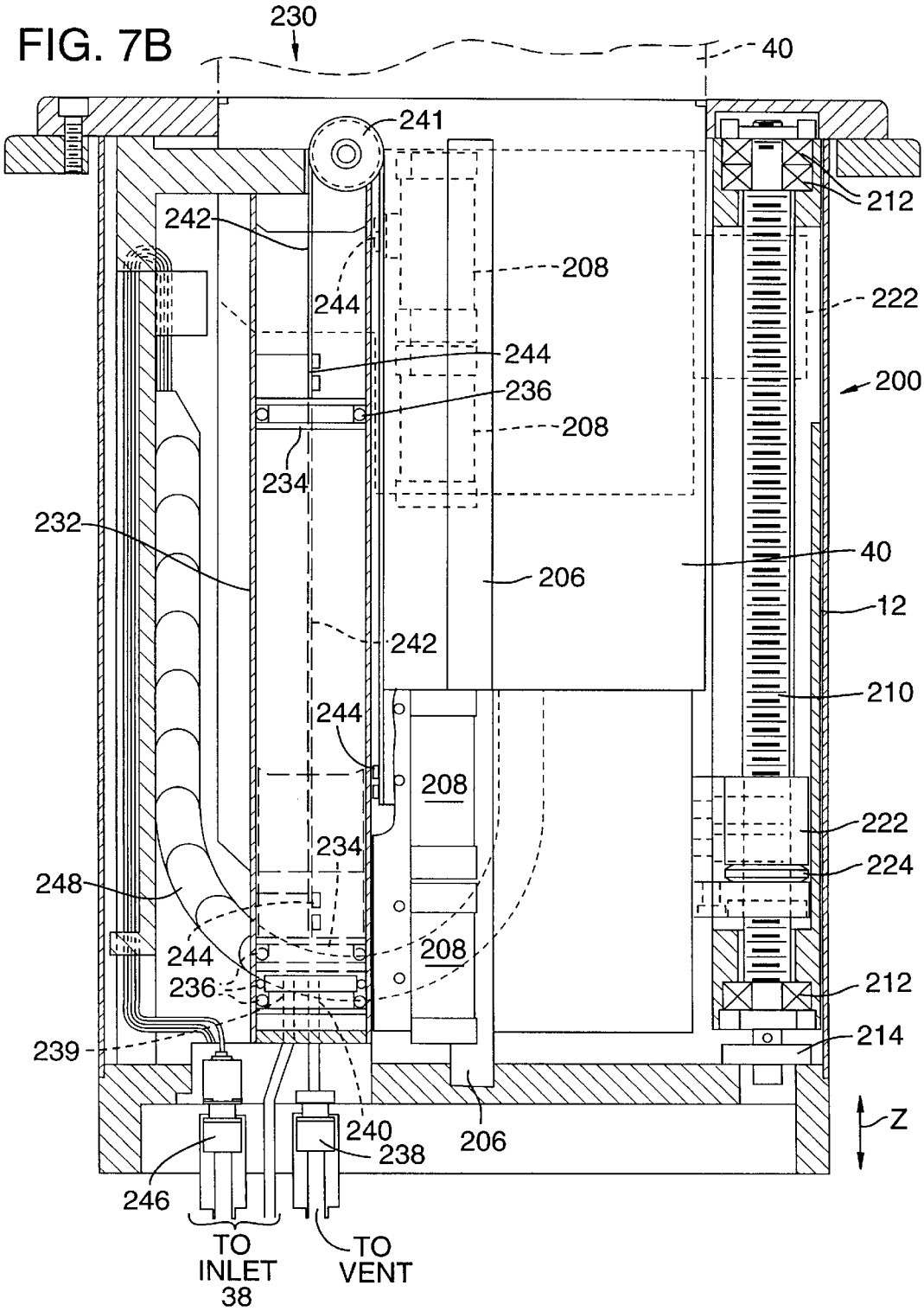
FIG. 7B is a sectional view taken along lines 7B—7B of FIG. 7A showing fully elevated and fully lowered positions of the tube, carriages, Z-axis movement mechanisms, and vacuum counterbalance system of the unitary prealigner and robot arm mechanism of FIGS. 1 and 4.

FIGS. 7A and 7B show the mechanism for moving tube 40 in the Z-axis direction. For clarity, FIG. 7B shows tube 40 and associated components in a fully lowered position (in solid lines) and in a fully elevated position (in dashed lines). In particular, tube 40 is movably suspended within base housing 12 by a robot arm Z-axis mechanism 200. Z-axis mechanism 200 is rigidly supported by a generally hemicylindrical structural backbone 202 that is attached within base housing 12 and substantially surrounds half of tube 40. For strength and rigidity, structural backbone 202 is preferably milled from an aluminum block and is shaped to include a pair of end faces 204, to each of which is attached a guiderail 206 that is aligned in the Z-axis direction.

Attached to opposite outer surface sides of tube 40 are pairs of bearing trucks 208 that are positioned to ride along guiderails 206. Structural backbone further includes a recess in which a leadscrew 210 is aligned in the Z-axis direction and supported between a pair of thrust bearings 212. Leadscrew 210 includes a leadscrew pulley 214 that is coupled to a leadscrew drive motor 216 by an endless belt 218, which is suitably tensioned by an idler pulley 220. Controllable rotation of leadscrew 210 is thereby effected by leadscrew drive motor 216.

Attached to an outer surface side of tube 40 at a position medially between bearing trucks 208 is a leadnut attachment 222 that captivates a leadnut 224 that mates with and rides along leadscrew 210. Controllable elevation of tube 40 is thereby effected through rotation of leadscrew 210 by leadscrew drive motor 216. A conventional linear encoder scale (not shown) is coupled to tube 40 and is in communication with motor controller 54 for accurately determining the elevational positions of tube 40.

Because tube 40 carries robot arm 13, prealigner mechanism 41, and their associated positioning mechanisms, leadscrew 210 controllably elevates a significant amount of movable mass. To maintain its elevational accuracy, minimize wear, and reduce the power, size, and strength of the components constituting Z-axis mechanism 200, a vacuum-assisted counterbalance system 230 is employed to reduce the deleterious effects of the movable mass.

Vacuum-assisted counterbalance system 230 employs a pair of cylinders 232, into each of which is fitted a slidable piston 234. Substantially pressure-tight integrity is ensured for cylinders 232 and pistons 234 by seals 236. Each of cylinders 232 and pistons 234 have a diameter of about 1.5 inches (3.8 centimeters), which yields a total piston area of about 3.53 square inches (22.8 square centimeters). Assuming cylinders 232 could be completely evacuated at standard temperature and pressure, a 51.9-pound (23.6-kilogram) atmospheric force would act to press pistons 234 into cylinders 232, a force substantially greater than the gravitational force acting on the movable mass of Z-axis mechanism 200. In this invention, however, vacuum valve controller 184 (FIG. 6) controls a Z-axis vacuum valve 238 such that a controllable amount of vacuum pressure is enclosed within cylinders 232 to cause the force acting on pistons 234 to substantially counterbalance the amount of gravitational force acting on the movable mass. The controllable amount of vacuum pressure is developed by supplying from inlet 38 a greater than needed vacuum pressure through a small orifice 239 into cylinders 232 and cycling Z-axis vacuum valve 238 to controllably bleed off vacuum pressure from cylinders 232 through a larger orifice 240 to a vent until the desired vacuum pressure is reached and maintained. The vacuum pressure inclosed by cylinders 232 is measured by a vacuum sensor (not shown).

Applying the force acting on pistons 234 to counterbalance the mass of tube 40 entails positioning a pair of pulleys 241 adjacent to the elevationally upper ends of guiderails 206, running an associated pair of counterbalance belts 242 over pulleys 241, and attaching with belt attachments 244 the opposite ends of counterbalance belts 242 to the respective associated pistons 234 and bearing trucks 208. The controllable vacuum-induced force acting downwardly on pistons 234 is thereby transferred through counterbalance belts 242, over pulleys 241, and upward on bearing trucks 208 to counterbalance the movable mass associated with tube 40.

Referring to FIGS. 6 and 7B, the amount of vacuum pressure received from vacuum pressure inlet 38 and enclosed by cylinders 232 as controlled by Z-axis vacuum valve 238 is further controlled as follows. During normal operation, microprocessor 176 commands servo amplifier 182 to cause leadscrew drive motor 216 to rotate in the CW and CCW directions, during which times the amount of current required by leadscrew drive motor 216 is sampled in servo amplifier 182, which generates and transmits to microprocessor 176 a signal representative of the amount of current required. Microprocessor 176 responds by commanding vacuum valve controller 184 to cause Z-axis vacuum valve 238 to bleed off and, thereby, regulate the amount of vacuum pressure in cylinders 232 to an amount that balances the amounts of current required to rotate leadscrew drive motor 216 in the CW and CCW directions. Microprocessor 176 may also accelerate and/or augment Z-axis movements by commanding vacuum valve controller 184 to momentarily decrease or increase the amount of pressure in cylinders 232 at the starts of and/or during their respective upward or downward movements.

Microprocessor 176 also commands vacuum valve controller 184 to selectively actuate vacuum valves 246 (only one shown) that supply vacuum pressure to vacuum pressure outlets 36 and 46 in hand 30 and chuck 43, respectively. The manner of sequencing vacuum valves 246 is described with reference to FIGS. 10A through 10G.

Finally, microprocessor 176 provides prealigner mechanism 41 motor positioning signals to servomechanism amplifier 182, which delivers corresponding command signals to motors 45 and 142. Servomechanism amplifier 182 receives from their associated encoders signals indicative of the angular position of motor 45 and the Z-axis position of movable carriage 42 relative to tube 40.

A flexible cable service loop 248 provides to robot arm 13 and prealigner mechanism 41 flexible vacuum pressure conduits to hand 30 and chuck 43; control cables to motors 45, 50, 52, and 142; and angular and linear position data from encoders 106, 108, and the position encoders not shown.

FIGS. 8A and 8B are respective fully elevated and fully lowered rear views of prealigner mechanism 41 and movable carriage 42 shown separated from tube 40 to reveal the stationary and movable spatial relationships of prealigner mechanism 41 components described with reference to FIGS. 4A and 4B. In addition, prealigner mechanism 41 includes a flexible cable service loop 250 that receives from cable service loop 248 (FIG. 7B) continuations of the flexible vacuum pressure conduit to chuck 43; the control cables to motors 45 and 142; and the angular and linear position data from position encoders (not shown) that measure the angular position of shaft 44 about a chuck axis 252 and the linear Z-axis position of movable carriage 42 along a movable carriage axis 254. A specimen edge detector 256 is attached atop prealigner mechanism 41.

FIGS. 9A, 9B, and 9C are respective top, side, and end views of specimen edge detector 256, which is shown cut away to reveal its internal components. In particular, linear detector array 49 is mounted in upper arm 48 and aligned radially apart from chuck axis 252 so as to view a peripheral edge 260 of specimen 29. Linear detector array 49 is preferably a Part No. RL1024D manufactured by EG&G Reticon of Sunnyvale, Calif. The radial distance from chuck axis 252 to the center of linear detector array 49 is substantially the same as the average radius of specimen 29. Of course, the radial distance may be adjusted to suit particular types and sizes of specimens.

Edge detector 256 further includes a lamp 262 positioned to illuminate a mirror 264 that reflects light through a lens 266 in a focused beam that lands on linear detector array 49. Data generated by linear detector array 49 are indicative of the degree to which peripheral edge 260 of specimen 29 casts a shadow on linear detector array 49. As motor 45 rotates specimen 29, the data and related angular position encoder data are conveyed to microprocessor 176 (FIG. 6) for storage and subsequent computation of specimen 29 related parameters, such as its effective center, eccentricity, and location of indicia. Further details regarding the construction and operation of edge detector 256 are described in the aforementioned U.S. Pat. No. 5,513,948, which is hereby incorporated by reference.

FIGS. 10A through 10G show various relative positions of robot arm 13 and prealigner mechanism 41 in an exemplary operational sequence in which robot arm 13 retrieves a semiconductor wafer 270 in an arbitrary orientation from a first location, such as a wafer cassette 272; aligns wafer 270 to a predetermined orientation; and delivers wafer 270 in the predetermined orientation to a second location, such as an inspection station 274. In this example, wafer 270 is shown as transparent for illustrative clarity, although specimens are typically opaque. Wafer 270 also has an effective center 276, a peripheral edge 278, and an orientation notch 280. Wafer 270 is stored in wafer cassette 272 at an arbitrary first Z-elevation (not shown) and placed on inspection station 274 at an arbitrary second Z-elevation (also not shown).

FIG. 10A shows a specimen retrieval operation in which upper arm 14 and forearm 22 cooperatively rotate in the first operational state of motor controller 54 to linearly extend hand 30 to reach and retrieve wafer 270. Hand 30 has a grasp center 282 that is located equidistant between the centers of vacuum pressure outlets 36. To accomplish the retrieval operation, upper arm 14 rotates CCW or CW 90 degrees about shoulder axis 16 and Z-axis mechanism 200 (FIG. 7B) elevates hand 30 to the first Z-elevation. When hand 30 is extended, vacuum valve controller 184 (FIG. 6) causes vacuum pressure to be applied to vacuum pressure outlets 36 of hand 30 to secure wafer 270 thereto. During this operation, movable carriage 42 (FIGS. 1, 4, and 8) has positioned prealigner chuck 43 and associated edge detector 256 (FIGS. 8 and 9) at a Z-elevation relative to tube 40 that clears robot arm 13.

FIG. 10B shows a prealigner placement operation in which upper arm 14 and forearm 22 cooperatively rotate in the first operational state of motor controller 54 to linearly retract hand 30 holding wafer 270 such that grasp center 282 is centered over chuck axis 252. To accomplish this incremental movement, upper arm 14 rotates CCW another 90 degrees about shoulder axis 16. When, during its rotation, upper arm 14 clears edge detector 256, movable carriage 42 raises chuck 43 to a Z-elevation just lower than the first Z-elevation of wafer 270. This Z-elevation allows wafer 270 to move between lower arm 47 and upper arm 48 of edge detector 256. When wafer 270 is properly positioned over chuck axis 252, movable carriage 42 slightly raises chuck 43 into contact with wafer 270, at which time microprocessor 176 causes vacuum valve controller 184 to transfer vacuum pressure from vacuum pressure outlets 36 in hand 30 to vacuum pressure outlet 46 in chuck 43, thereby releasing wafer 270 from hand 30 and securing it on chuck 43. In this position, peripheral edge 278 of wafer 270 is positioned adjacent to linear detector array 49 and effective center 276 is not necessarily centered over chuck axis 252.

FIG. 10C shows a wafer edge scanning operation in which prealigner chuck 43 rotates wafer 270 CW or CCW at least 360 degrees while linear detector array 49 transmits peripheral edge 278 radial distance data to microprocessor 176 to determine the angular, X-axis, and Y-axis locations of effective center 276 and orientation notch 280.

FIG. 10D shows a wafer reorientation operation in which chuck 43 rotates wafer 270 so that effective center 276 is collinear with orientation notch 280 and shoulder axis 16.

FIG. 10E shows an angular correction operation in which upper arm 14, forearm 22, and hand 30 co-rotate CCW along a circular path about shoulder axis 16 in the second operational state of motor controller 54 to position grasp center 282 so it is collinear with effective center 276, orientation notch 280, and shoulder axis 16.

FIG. 10F shows an extension correction operation in which upper arm 14 and forearm 22 cooperatively rotate in the first operational state of controller 54 to linearly extend hand 30 so that grasp center 282 overlays effective center 276. This operation places wafer 270 in a predetermined alignment. When wafer 270 is in the predetermined alignment, movable carriage 42 slightly lowers chuck 43 while microprocessor 176 simultaneously causes vacuum valve controller 184 to transfer vacuum pressure from vacuum pressure outlet 46 in chuck 43 to vacuum pressure outlets 36 in hand 30, thereby releasing wafer 270 from chuck 43 and securing it once again on hand 30.

FIG. 10G shows a specimen placement operation in which upper arm 14 and forearm 22 cooperatively rotate in the first operational state of controller 54 to linearly extend hand 30 to deliver wafer 270 in the predetermined alignment to processing station 274. To accomplish this incremental movement, upper arm 14 rotates CW 90 degrees about shoulder axis 16 and Z-axis mechanism 200 (FIG. 7B) elevates or lowers hand 30 to the second Z-elevation. When hand 30 is extended, vacuum valve controller 184 (FIG. 6) releases vacuum pressure from vacuum pressure outlets 36 of hand 30 to place wafer 270 in the predetermined alignment on inspection station 274. During this operation, movable carriage 42 (FIGS. 1, 4, and 8) repositions prealigner chuck 43 and associated edge detector 256 (FIGS. 8 and 9) to a Z-elevation relative to tube 40 that clears robot arm 13.

Following the specimen placement operation, upper arm 14 and forearm 22 cooperatively rotate in the first operational state of controller 54 to linearly retract hand 30 after the release of vacuum pressure at outlets 36 to leave wafer 270 at inspection station 274.

In the foregoing example, wafer cassette 272 and inspection station 274 are shown for illustrative clarity at the same location. In practice, wafer cassette 272 and inspection station 274 are typically angularly displaced in the CW or CCW directions around shoulder axis 16.

Also in the foregoing example, FIGS. 10A and 10G show prealigner mechanism 41 located under distal end 18 of upper arm 14. Such a location allows directly placing wafer 270 over chuck 43 during the prealigner placement operation of FIG. 10B but requires lowering and raising prealigner mechanism 41 to respectively clear upper arm 14 and receive wafer 270. Such elevational changes of prealigner mechanism 41 can be avoided by orienting unitary mechanism 10 as shown in FIGS. 1A and 1B, in which prealigner mechanism 41 is located adjacent to the proximal end of upper arm 14 and is at a Z-elevation suitable for receiving wafer 270. In this orientation, robot arm 13 first performs a specimen retrieval operation in which upper arm 14 and forearm 22 first cooperatively rotate in the first operational state of motor controller 54 to linearly retract hand 30 holding wafer 270 and then corotate CW along a circular path about shoulder axis 16 in the second operational state of motor controller 54 until grasp center 282 is centered over chuck axis 252.

The relative locations and orientations chosen for wafer cassette 272, prealigner mechanism 41, and inspection station 274 have corresponding tradeoffs in terms of work area required and wasted motion that impacts wafer processing throughput. The preferred locations and orientations are those described in FIGS. 10A through 10G and in which inspection station 274 is angularly displaced from wafer cassette 272. Significant improvements in wafer processing throughput are possible by employing Z-axis mechanism 200 to concurrently move robot arm 13 and prealigner mechanism 41 between the first and second Z-elevations during the operations shown in FIGS. 10B through 10F.

Skilled workers will recognize that portions of this invention may be implemented differently from the implementation described above for a preferred embodiment. For example, hand 30 may employ either a single-ended or a double-ended end effector with or without a forked end, specimen gripping may be by a vacuum or pnumatically actuated specimen edge gripper or fingers, robot arm 13 is not limited to the number of movable elements described, and prealigner mechanism 41 may move in the Z-axis direction independently of tube 40 or may have a fixed elevation relative to tube 40. Of course, many other specimen shapes, sizes, types, and predetermined alignments may be employed with this invention.

It will be obvious to those having skill in the art that many changes may be made to the details of the above-described embodiment of this invention without departing from the underlying principles thereof. Accordingly, it will be appreciated that this invention is also applicable to specimen alignment and handling applications other than those found in integrated circuit wafer processing. The scope of the present invention should, therefore, be determined only by the following claims.

We claim:

1. A unitary prealigner and robot arm apparatus for grasping, aligning, and delivering a specimen in a predetermined alignment, comprising:

a robot arm having a hand for grasping and delivering the specimen, the hand being movable in an arcuate direction around an axis of rotation and movable in a radial direction relative to the axis of rotation;

a Z-axis mechanism for moving the robot arm in a Z-axis direction; and a prealigner mechanism for aligning the specimen, the prealigner mechanism coupled to the Z-axis mechanism and movable relative to the robot arm in the Z-axis direction.

2. The apparatus of claim 1 in which the robot arm and the prealigner mechanism each have a movable mass and in which the Z-axis mechanism includes a counterbalance system that provides a counterbalancing force that compensates for the movable mass of at least one of the robot arm and the prealigner mechanism.

3. The apparatus of claim 2 in which the counterbalancing force is an adjustable counterbalancing force and the counterbalance system comprises a fluid pressure-assisted counterbalance system that provides the adjustable counterbalancing force.

4. The apparatus of claim 3 in which the fluid pressure-assisted counterbalance system further includes a piston slidable in a cylinder containing a controllable amount of a vacuum pressure to provide the adjustable counterbalancing force.

5. The apparatus of claim 4 in which at least one of a belt and a pulley couple the counterbalancing force from the piston to the movable mass.

6. The apparatus of claim 2 further comprising a structural backbone that supports the Z-axis mechanism and slidably supports the robot arm, the Z-axis mechanism including a motor turning a leadscrew that is coupled to the robot arm by a leadnut.

7. The apparatus of claim 2 in which the Z-axis mechanism further includes a motor controller driving a motor and sensing an amount of motor current required to move the robot arm in the Z-axis direction, the motor controller providing to the counterbalancing system a signal responsive to the amount of motor current for adjusting the counterbalancing force required to compensate for the movable mass.

8. The apparatus of claim 7 in which the Z-axis direction includes upward and downward directions and the signal is adjusted by the motor controller such that substantially a same amount of motor current is required to move the Z-axis mechanism in the upward and downward directions.

9. The apparatus of claim 7 in which the signal is further adjusted by the motor controller such that the counterbalancing force assists an acceleration of the movable mass in the Z-axis direction.

10. The apparatus of claim 1 in which the robot arm includes first and second motors having first and second spindles that cooperate to move the hand in the arcuate and radial directions, the first and second motors positioned in a concentric relationship such that their respective first and second spindles rotate about a common axis.

11. The apparatus of claim 10 in which the first and second spindles each have bearings that are journaled on a common structural element.

12. The apparatus of claim 1 in which the hand comprises at least one forked end having a vacuum pressure outlet for releasably grasping the specimen.

13. The apparatus of claim 1 in which the prealigner mechanism comprises a specimen edge detector and a rotatable chuck having a vacuum pressure outlet for releasably grasping the specimen, the robot arm and the prealigner mechanism cooperating to transfer the specimen from the hand to the rotatable chuck, the rotatable chuck rotating a peripheral edge of the specimen adjacent to the specimen edge detector to determine a center and an alignment of the specimen, and the prealigner mechanism and the robot arm cooperating to deliver the specimen in a predetermined alignment.

14. The apparatus of claim 1 further including a motor-controlled moving carriage coupled to the Z-axis mechanism for moving the prealigner mechanism in the Z-axis direction relative to the robot arm.

15. The apparatus of claim 14 in which the moving carriage is coupled to the Z-axis mechanism to effect movement of the prealigner mechanism in the Z-axis direction relative to the robot arm.

16. A method for orienting a specimen having an effective center and an alignment indicia in a predetermined alignment, the method comprising:

providing a robot arm having a hand with a grasp center for releasibly grasping the specimen, the hand being movable in an arcuate direction around an axis of rotation and movable in a radial direction relative to the axis of rotation;

providing a Z-axis mechanism for moving the robot arm in a Z-axis direction;

coupling a prealigner mechanism having an edge detector and a rotatable chuck to the robot arm, the prealigner mechanism coupled to the Z-axis mechanism and movable relative to the robot arm in the Z-axis direction;

retrieving with the robot arm the specimen from a first specimen location having a first Z-axis elevation;

transferring the specimen from the hand to the rotatable chuck;

manipulating the prealigner mechanism and the robot arm to orient the specimen in the predetermined alignment;

transferring the specimen from the rotatable chuck to the hand; and placing the specimen in the predetermined alignment at a second specimen location having a second Z-axis elevation.

17. The method of claim 16 in which the manipulating step includes:

rotating the chuck to move a peripheral edge of the specimen past the edge detector to locate the effective center and the alignment indicia of the specimen;

rotating the chuck such that the effective center is collinear with the alignment indicia and the axis of rotation of the robot arm;

moving the hand in the arcuate direction such that the grasp center is collinear with the effective center, the alignment indicia, and the axis of rotation of the robot arm; and moving the hand in the radial direction such that the grasp center overlays the effective center of the specimen.

18. The method of claim 16 in which the retrieving and placing steps include grasping the specimen with the hand, moving the hand in the radial direction, and transferring the specimen between the hand and the rotatable chuck.

19. The method of claim 16 in which the hand and the rotatable chuck have associated vacuum pressure outlets for grasping the specimen, and in which the transferring steps comprise moving the rotatable chuck in the Z-axis direction relative to the hand and exchanging a vacuum pressure between the associated vacuum pressure outlets to grasp the specimen by one of the hand and the rotating chuck.

20. The method of claim 16 further including moving the robot arm in the Z-axis direction concurrently with at least one of the retrieving, manipulating, transferring, and placing steps.

21. The method of claim 20 in which the moving step is carried out between the first and second Z-axis elevations.

22. The method of claim 16 in which the first and second specimen locations are displaced from one another in at least one of the arcuate, radial, and Z-axis directions.

23. A unitary prealigner and robot arm apparatus for grasping, aligning, and delivering a specimen in a predetermined alignment, comprising:

a robot arm having a movable mass and including a hand for grasping and delivering the specimen, the hand being movable in an arcuate direction around an axis of rotation and movable in a radial direction relative to the axis of rotation;

a Z-axis mechanism for moving the robot arm in a Z-axis direction;

a prealigner mechanism for aligning the specimen, the prealigner mechanism having a movable mass and coupled to the Z-axis mechanism and movable relative to the robot arm in the Z-axis direction; and a counterbalance system coupled to the Z-axis mechanism that provides a counterbalancing force that compensates for the movable mass of at least one of the robot arm and the prealigner mechanism.

24. The apparatus of claim 23 in which the counterbalancing force is an adjustable counterbalancing force and the counterbalance system comprises a fluid pressure-assisted counterbalance system that provides the adjustable counterbalancing force.

25. The apparatus of claim 24 in which the fluid pressure-assisted counterbalance system further includes a piston slidable in a cylinder containing a controllable amount of a vacuum pressure to provide the adjustable counterbalancing force.

26. The apparatus of claim 25 in which at least one of a belt and a pulley couple the counterbalancing force from the piston to the movable mass.

27. The apparatus of claim 23 further comprising a structural backbone that supports the Z-axis mechanism and slidably supports the robot arm, the Z-axis mechanism including a motor turning a leadscrew that is coupled to the robot arm by a leadnut.

28. The apparatus of claim 23 in which the Z-axis mechanism further includes a motor controller driving a motor and sensing an amount of motor current required to move the robot arm in the Z-axis direction, the motor controller providing to the counterbalancing system a signal responsive to the amount of motor current for adjusting the counterbalancing force required to compensate for the movable mass.

29. The apparatus of claim 28 in which the Z-axis direction includes upward and downward directions and the signal is adjusted by the motor controller such that substantially a same amount of motor current is required to move the Z-axis mechanism in the upward and downward directions.

30. The apparatus of claim 28 in which the signal is further adjusted by the motor controller such that the counterbalancing force assists an acceleration of the movable mass in the Z-axis direction.

31. A unitary prealigner and robot arm apparatus for grasping, aligning, and delivering a specimen in a predetermined alignment, comprising:

a robot arm having a hand for grasping and delivering the specimen, the hand being movable in an arcuate direction around an axis of rotation and movable in a radial direction relative to the axis of rotation, the robot arm including first and second motors having first and second spindles that cooperate to move the hand in the arcuate and radial directions, the first and second motors positioned in a concentric relationship such that their respective first and second spindles rotate about a common axis;

a Z-axis mechanism for moving the robot arm in a Z-axis direction; and a prealigner mechanism for aligning the specimen, the prealigner mechanism coupled to the Z-axis mechanism and movable relative to the robot arm in the Z-axis direction.

32. The apparatus of claim 31 in which the first and second spindles each have bearings that are journaled on a common structural element.

33. A unitary prealigner and robot arm apparatus for grasping, aligning, and delivering a specimen in a predetermined alignment, comprising:

a robot arm including a hand having at least one forked end in which a vacuum pressure releasibly grasps and delivers the specimen, the hand being movable in an arcuate direction around an axis of rotation and movable in a radial direction relative to the axis of rotation;

a Z-axis mechanism for moving the robot arm in a Z-axis direction; and a prealigner mechanism for aligning the specimen, the prealigner mechanism coupled to the Z-axis mechanism and movable relative to the robot arm in the Z-axis direction.

34. A unitary prealigner and robot arm apparatus for grasping, aligning, and delivering a specimen in a predetermined alignment, comprising:

a robot arm having a hand for grasping and delivering the specimen, the hand being movable in an arcuate direction around an axis of rotation and movable in a radial direction relative to the axis of rotation;

a Z-axis mechanism for moving the robot arm in a Z-axis direction;

a motor-controlled moving carriage coupled to the Z-axis mechanism that moves in the Z-axis direction relative to the robot arm; and a prealigner mechanism for aligning the specimen, the prealigner mechanism coupled to the motor-controlled moving carriage to move the prealigner mechanism relative to the robot arm in the Z-axis direction.

* * * * *